(12) United States Patent
Wack et al.

(10) Patent No.: US 11,333,621 B2
(45) Date of Patent: May 17, 2022

(54) METHODS AND SYSTEMS FOR SEMICONDUCTOR METROLOGY BASED ON POLYCHROMATIC SOFT X-RAY DIFFRACTION

(71) Applicant: KLA-Tencor Corporation, Milpitas, CA (US)

(72) Inventors: Daniel Wack, Fredericksburg, VA (US); Oleg Khodykin, Santa Cruz, CA (US); Andrei V. Shchegrov, Campbell, CA (US); Alexander Kuznetsov, Austin, TX (US); Nikolay Artemiev, Berkeley, CA (US); Michael Friedmann, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 259 days.

(21) Appl. No.: 16/030,849

(22) Filed: Jul. 9, 2018

(65) Prior Publication Data

US 2019/0017946 A1    Jan. 17, 2019

Related U.S. Application Data

(60) Provisional application No. 62/531,187, filed on Jul. 11, 2017.

(51) Int. Cl.
  *G01N 23/201*    (2018.01)
  *G01N 23/20008*   (2018.01)
  (Continued)

(52) U.S. Cl.
  CPC ..... *G01N 23/201* (2013.01); *G01N 23/20008* (2013.01); *G01N 2223/054* (2013.01);
  (Continued)

(58) Field of Classification Search
  CPC ......... G01N 2223/6116; G01N 23/201; G01N 23/20008; G01N 2223/054
  See application file for complete search history.

(56) References Cited

U.S. PATENT DOCUMENTS

| 5,177,774 A | 1/1993 | Suckewer et al. |
| 5,608,526 A | 3/1997 | Piwonka-Corle et al. |

(Continued)

FOREIGN PATENT DOCUMENTS

| WO | 2017-071925 A1 | 5/2017 |
| WO | 2017-087569 A1 | 5/2017 |

OTHER PUBLICATIONS

International Search Report dated Oct. 26, 2018, for PCT Application No. PCT/US2018/041533 filed on Jul. 11, 2018, by KLA-Tencor Corporation, 3 pages.

(Continued)

*Primary Examiner* — Chih-Cheng Kao
(74) *Attorney, Agent, or Firm* — Spano Law Group; Joseph S. Spano

(57) ABSTRACT

Methods and systems for performing measurements of semiconductor structures based on high-brightness, polychromatic, reflective small angle x-ray scatterometry (RSAXS) metrology are presented herein. RSAXS measurements are performed over a range of wavelengths, angles of incidence, and azimuth angles with small illumination beam spot size, simultaneously or sequentially. In some embodiments, RSAXS measurements are performed with x-ray radiation in the soft x-ray (SXR) region at grazing angles of incidence in the range of 5-20 degrees. In some embodiments, the x-ray illumination source size is 10 micrometers or less, and focusing optics project the source area onto a wafer with a demagnification factor of 0.2 or less, enabling an incident x-ray illumination spot size of less than two micrometers. In another aspect, active focusing optics project programmed (Continued)

ranges of illumination wavelengths, angles of incidence, and azimuth angles, or any combination thereof, onto a metrology area, either simultaneously or sequentially.

27 Claims, 6 Drawing Sheets

(51) Int. Cl.
  *H01L 21/67* (2006.01)
  *H01L 21/66* (2006.01)
(52) U.S. Cl.
  CPC ............ *G01N 2223/6116* (2013.01); *H01L 21/67259* (2013.01); *H01L 21/67288* (2013.01); *H01L 22/12* (2013.01)

(56) References Cited

U.S. PATENT DOCUMENTS

| | | | |
|---|---|---|---|
| 5,757,882 A * | 5/1998 | Gutman | G21K 1/062 378/82 |
| 5,859,424 A | 1/1999 | Norton et al. | |
| 6,023,338 A | 2/2000 | Bareket | |
| 6,429,943 B1 | 8/2002 | Opsal et al. | |
| 6,716,646 B1 | 4/2004 | Wright et al. | |
| 6,778,275 B2 | 8/2004 | Bowes | |
| 6,787,773 B1 | 9/2004 | Lee | |
| 6,992,764 B1 | 1/2006 | Yang et al. | |
| 7,242,477 B2 | 7/2007 | Mieher et al. | |
| 7,321,426 B1 | 1/2008 | Poslavsky et al. | |
| 7,351,980 B2 | 4/2008 | Lange | |
| 7,406,153 B2 | 7/2008 | Berman | |
| 7,478,019 B2 | 1/2009 | Zangooie et al. | |
| 7,599,470 B2 | 10/2009 | Kloepfel et al. | |
| 7,626,702 B2 | 12/2009 | Ausschnitt et al. | |
| 7,656,528 B2 | 2/2010 | Abdulhalim et al. | |
| 7,705,331 B1 | 4/2010 | Kirk et al. | |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,920,676 B2 | 4/2011 | Yun et al. | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 8,749,179 B2 | 6/2014 | Liu et al. | |
| 8,941,336 B1 | 1/2015 | Liu et al. | |
| 9,915,522 B1 | 3/2018 | Jiang et al. | |
| 2003/0021465 A1 | 1/2003 | Adel et al. | |
| 2003/0058986 A1 * | 3/2003 | Oshino | G21K 1/062 378/34 |
| 2003/0067598 A1 | 4/2003 | Tomie et al. | |
| 2004/0170252 A1 | 9/2004 | Richardson | |
| 2005/0094766 A1 * | 5/2005 | Yokhin | G01N 23/201 378/86 |
| 2006/0062351 A1 * | 3/2006 | Yokhin | G01N 23/20008 378/86 |
| 2006/0103725 A1 | 5/2006 | Brown et al. | |
| 2007/0221842 A1 | 9/2007 | Morokuma et al. | |
| 2007/0228288 A1 | 10/2007 | Smith et al. | |
| 2008/0143981 A1 | 6/2008 | Ehm et al. | |
| 2008/0273662 A1 * | 11/2008 | Yun | G01N 23/201 378/74 |
| 2009/0152463 A1 | 6/2009 | Toyoda et al. | |
| 2010/0188655 A1 | 7/2010 | Brown et al. | |
| 2010/0188738 A1 | 7/2010 | Epple et al. | |
| 2010/0213395 A1 | 8/2010 | Ueno et al. | |
| 2011/0141865 A1 | 6/2011 | Senekerimyan et al. | |
| 2011/0240890 A1 | 11/2011 | Govindaraju et al. | |
| 2011/0266440 A1 | 11/2011 | Boughorbel et al. | |
| 2012/0051518 A1 * | 3/2012 | Omote | G01N 23/201 378/86 |
| 2012/0292502 A1 | 11/2012 | Langer et al. | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0198975 A1 * | 7/2014 | Nakagaki | G01N 23/2251 382/149 |
| 2014/0222380 A1 | 8/2014 | Kuznetsov et al. | |
| 2014/0297211 A1 | 10/2014 | Pandev et al. | |
| 2015/0110249 A1 | 4/2015 | Bakeman et al. | |
| 2015/0117610 A1 | 4/2015 | Veldman et al. | |
| 2015/0194287 A1 * | 7/2015 | Yun | G01N 23/223 378/44 |
| 2015/0204664 A1 | 7/2015 | Bringoltz et al. | |
| 2015/0204802 A1 * | 7/2015 | Pois | G01N 23/201 378/86 |
| 2015/0300965 A1 * | 10/2015 | Sezginer | G01N 23/207 378/86 |
| 2017/0131129 A1 | 5/2017 | Ahr et al. | |

OTHER PUBLICATIONS

Shanblatt, Elisabeth, R. et al., "High Numerical Aperture Reflection Mode Coherent Diffractive Imaging of Nano-Patterned Surfaces using a Tabletop Extreme Ultraviolet Source," in Imaging and Applied Optics 2015, OSA Technical Digest (online) (Optical Society of America, 2015), paper CW4E.4.
Abbey, Brian et al., "Lensless Imaging Using Broadband X-Ray Sources," Nature Photonics 5, 420-424 (2011).
Cadenazzi, G. et al., "Coherent Diffraction Imaging With Absorption Contrast Using Broadband Tabletop Soft X-Ray Sources," CLEO: Science and Innovations 2015, OSA Technical Digest (online) (Optical Society of America, 2015), paper STu4N.4.
Sunday, Daniel F., "Three dimensional x-ray metrology for block copolymer lithography line-space patterns," JJ. Micro/Nanolith. MEMS MOEMS 12(3) 031103, Aug. 21, 2013.
Soltwisch, V. et al., "Reconstructing Detailed Line Profiles of Lamellar Gratings from GISAXS Patterns with a Maxwell Solver," J. Appl. Cryst. (2017). 50, 1524-1532.

* cited by examiner

METHODS AND SYSTEMS FOR
SEMICONDUCTOR METROLOGY BASED
ON POLYCHROMATIC SOFT X-RAY
DIFFRACTION

CROSS REFERENCE TO RELATED
APPLICATION

The present application for patent claims priority under 35 U.S.C. § 119 from U.S. provisional patent application Ser. No. 62/531,187, filed Jul. 11, 2017, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

Accurate information concerning the material composition and shape of nanostructures is limited in the process development environment of a leading-edge front-end semiconductor fabrication facility. Scatterometric optical metrology systems rely on accurate geometric and dispersion models to avoid measurement bias. With limited knowledge of material composition and shape of nanostructures available apriori, measurement recipe development and validation is a slow and tedious process. For example, cross-sectional transmission electron microscopy (TEM) images are used to guide optical scatterometry model development, but TEM imaging is slow and destructive.

Scatterometric optical metrology tools utilizing infrared to visible light measure zero-order diffraction signals from sub-wavelength structures. As device critical dimensions continue to shrink scatterometric optical metrology sensitivity and capability is decreasing. Furthermore, when absorbing materials are present in the structure under measurement, penetration and scattering of illumination light in the optical region (e.g., 0.5-10 ev) limits the utility of conventional optical metrology systems.

Similarly, electron beam based metrology systems struggle to penetrate semiconductor structures due to absorption and scattering of the illuminating, backscattered, and secondary emission electrons.

Atomic force microscopes (AFM) and scanning-tunneling microscopes (STM) are able to achieve atomic resolution, but they can only probe the surface of the specimen. In addition, AFM and STM microscopes require long scanning times that make these technologies impractical in a high volume manufacturing (HVM) setting.

Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

Transmission, Small-Angle X-Ray Scatterometry (T-SAXS) systems employing photon at a hard X-ray energy level (>15 keV) have shown promise to address challenging measurement applications. However, scattering of hard x-rays from shallow structures, e.g., logic metrology applications, is weak, which severely limits achievable measurement resolution and throughput. As such, T-SAXS has not been shown to be a viable option for logic metrology applications in an HVM environment.

T-SAXS systems achieve a small beam footprint on the wafer due to near-normal incidence illumination. However, T-SAXS systems require high energy photons (e.g., >16 keV) for adequate transmission through a wafer under measurement. Typically diffraction efficiency scales with photon energy, E, as $1/E^2$ and angular separation of diffraction orders scales at $1/E$. To avoid order overlap for a 2D-periodic structure, the solid-angular acceptance scales as $1/E^2$. These scaling factors impose a strong penalty on T-SAXS systems for metrology of shallow structures.

In addition, the diffraction patterns from all previous patterned steps are superimposed on the diffraction pattern of the current layer structure in a transmission measurement. Since the minimum pitch (i.e., period) of critical metal layers is expected to converge to values differing by only 10-20%, angular acceptance is severely restricted to separate diffraction signals at the detector. Otherwise, the geometric information of all previous layers must be fed-forward to the metrology system characterizing the current layer. Typically, within the context of a complex high volume manufacturing environment, it is very difficult to obtain and manage the required metrology and process information.

Conventional GI-SAXS systems operate near the critical angles for reflection (e.g., grazing angle of less than one degree) for semiconductor materials and photon energies above 8 keV to maximize diffracted intensity. This leads to an extremely large illumination beam spot size projected onto the wafer (e.g., greater than 1 mm). This is so large that even scribe-line metrology targets are unuseable. Thus, extremely large, specialized metrology targets must be constructed on the wafer to perform GI-SAXS measurements. This loss of functional wafer real estate is costly. In addition, the surface sensitivity of GI-SAXS measurements is excellent, but penetration of high aspect ratio structures is very limited due to evanescent field behavior.

In summary, there is a need for a dimensional metrology system having measurement capability for both low and high aspect ratio structures and an illumination beam spot size compatible with scribe-line targets. In one example, there is a need for a metrology system to estimate shape and edge placement parameters of high aspect ratio (HAR) structures at HVM throughputs. In addition, it should be possible to develop and validate measurement recipes for the metrology system and operate the metrology system in a high volume manufacturing (HVM) environment without substantial prior dimensional and material composition information.

SUMMARY

Methods and systems for performing measurements of semiconductor structures based on high-brightness, polychromatic, reflective small angle x-ray scatterometry (RSAXS) metrology are presented herein. In this manner, a RSAXS system is employed to determine properties of a specimen based on one or more diffraction orders of scattered light.

RSAXS measurements of a semiconductor wafer are performed over a range of wavelengths, angles of incidence, and azimuth angles with a small illumination beam spot size (e.g., less than 50 micrometers across the effective illumination spot). In one aspect, the RSAXS measurements are performed with x-ray radiation in the soft x-ray (SXR) region (i.e., 80-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

In some embodiments, wavelengths emitted by an illumination source of an RSAXS metrology system are selectable by adjusting operating parameters of the illumination source.

In some embodiments, focusing optics include graded multi-layers that select desired wavelengths or ranges of wavelengths for projection onto a specimen. In some examples, focusing optics include a graded multi-layer structure that selects one wavelength and projects the selected wavelength onto a specimen over a range of angles of incidence. In some examples, focusing optics include a graded multi-layer structure that selects a range of wavelengths and projects the selected wavelengths onto a specimen over one angle of incidence. In some examples, focusing optics include a graded multi-layer structure that selects a range of wavelengths and projects the selected wavelengths onto a specimen over a range of angles of incidence.

The x-ray illumination source of an RSAXS metrology system produces x-ray emission over a source area having finite lateral dimensions (i.e., non-zero dimensions orthogonal to the beam axis. In one aspect, the source area of illumination source 110 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In another aspect, the ranges of wavelengths, angles of incidence, and azimuth angles, or any combination thereof, projected onto a metrology area, either simultaneously or sequentially, are adjusted by actively positioning one or more mirror elements of a system of focusing optics.

In a further aspect, the focusing optics project the illumination source onto a specimen under measurement with demagnification factor of 0.2 or less. This enables the size of the incident x-ray illumination spot to be less than two micrometers.

In another further aspect, an RSAX metrology system includes one or more beam slits or apertures to shape the x-ray illumination beam 114 incident on a specimen and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an RSAX metrology system includes one or more beam slits or apertures to select a set of illumination wavelengths that simultaneously illuminate a metrology target under measurement. In some embodiments, one or more slits are configured to sequentially pass different illumination wavelengths.

In some embodiments, a combined metrology tool includes a multiple wavelength SXR diffraction subsystem as described herein and an x-ray reflectometry subsystem to improve measurement throughput. In one embodiment, the multiple wavelength SXR diffraction subsystem and the x-ray reflectometry subsystem employ orthogonal planes of incidence that enable simultaneous measurements or sequential measurements without having to move the specimen under measurement or either of the optical measurement subsystems.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for measuring structural and material characteristics (e.g., material composition, dimensional characteristics of structures and films, etc.) of semiconductor structures associated with different semiconductor fabrication processes based on x-ray illumination are presented. More specifically, methods and systems for performing measurements of semiconductor structures based on high-brightness, polychromatic reflective small angle x-ray scatterometry (RSAXS) metrology are presented herein.

RSAXS measurements of a semiconductor wafer are performed over a range of wavelengths, angles of incidence, and azimuth angles with a small beam spot size (e.g., less than 50 micrometers across the effective illumination spot). In one aspect, the RSAXS measurements are performed with x-ray radiation in the soft x-ray (SXR) region (i.e., 80-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

Figure 1:
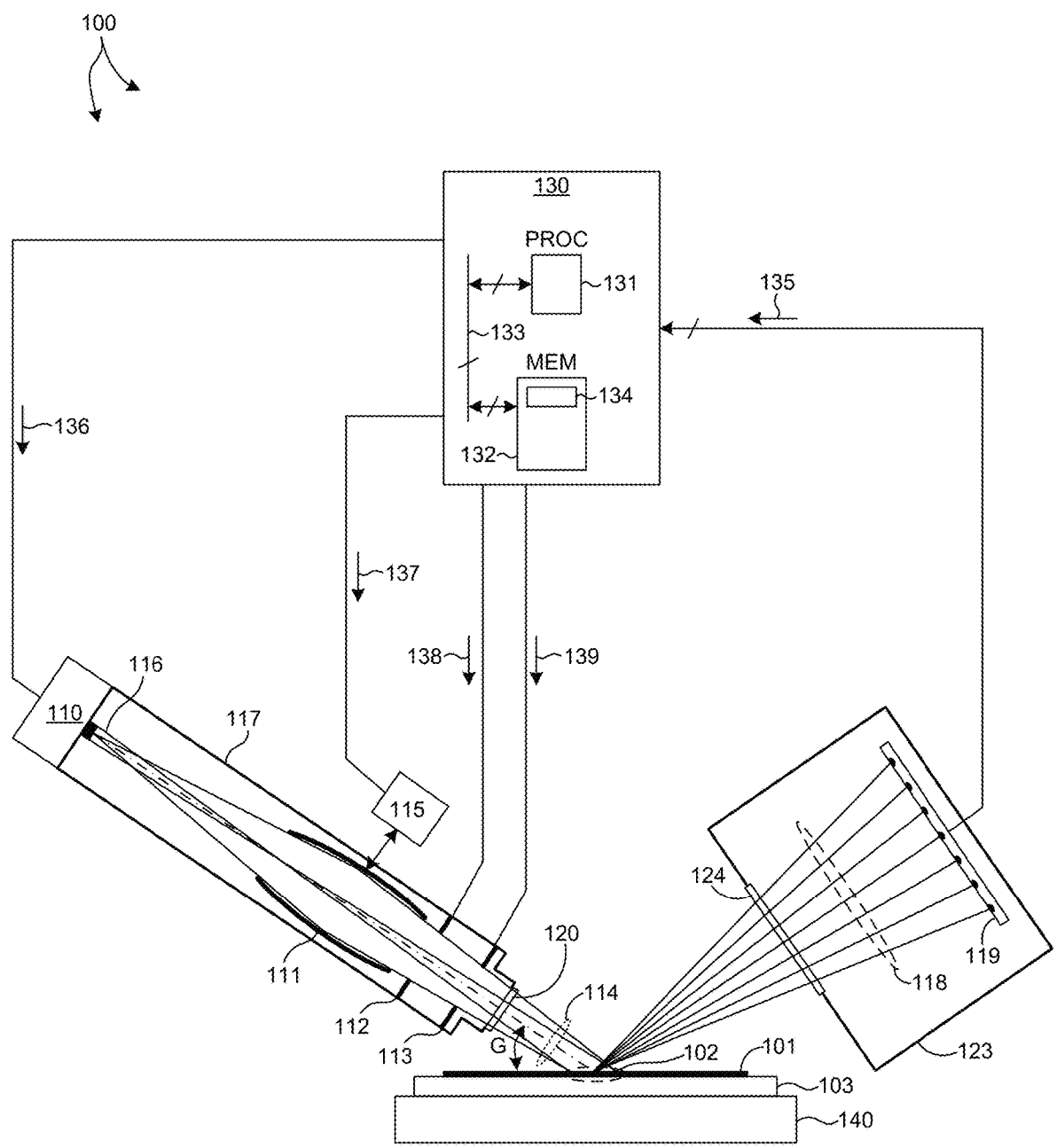
FIG. 1 is a simplified diagram illustrative of a an embodiment of a RSAXS metrology tool 100 for measuring characteristics of a specimen in at least one novel aspect.

FIG. 1 illustrates an embodiment of a RSAXS metrology tool 100 for measuring characteristics of a specimen in at least one novel aspect. As shown in FIG. 1, the system 100 may be used to perform RSAXS measurements over a measurement area 102 of a specimen 101 illuminated by an incident illumination beam spot.

In the depicted embodiment, metrology tool 100 includes an x-ray illumination source 110, focusing optics 111, beam divergence control slit 112, and slit 113. The x-ray illumination source 110 is configured to generate SXR radiation suitable for RSAXS measurements. X-ray illumination source 110 is a polychromatic, high-brightness, large etendue source. In some embodiments, the x-ray illumination source 110 is configured to generate x-ray radiation in a range between 80-3000 electron-volts. In general, any suitable high-brightness x-ray illumination source capable of generating high brightness SXR at flux levels sufficient to enable high-throughput, inline metrology may be contemplated to supply x-ray illumination for RSAXS measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 110 is a high harmonic generation (HHG) x-ray source. In some other embodiments, illumination source 110 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 110 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant SXR regions. For example, plasma emitted by Krypton provides high brightness at the Silicon K-edge. In another example, plasma emitted by Xenon provides high brightness throughout the entire SXR region of (80-3000 eV). As such, Xenon is a good choice of emitting material when broadband SXR illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. patent application Ser. No. 15/867,633, the content of which is incorporated herein by reference in its entirety.

In a further aspect, the wavelengths emitted by the illumination source (e.g., illumination source 110) are selectable. In some embodiments, illumination source 110 is a LPP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation. As depicted in FIG. 1, computing system 130 communicates command signals 136 to illumination source 110 that cause illumination source 110 to adjust the spectral range of wavelengths emitted from illumination source 110. In one example, illumination source 110 is a LPP light source, and the LPP light source adjusts any of a pulse duration, pulse frequency, and target material composition to realize a desired spectral range of wavelengths emitted from the LPP light source.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. In one aspect, the source area of illumination source 110 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 101. In some examples, the x-ray optics collimate or focus the x-ray beam onto measurement area 102 of specimen 101 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

As depicted in FIG. 1, focusing optics 111 focuses source radiation onto a metrology target located on specimen 101. The finite lateral source dimension results in finite spot size 102 on the target defined by the rays 116 coming from the edges of the source and any beam shaping provided by beam slits 112 and 113.

In some embodiments, focusing optics 111 includes elliptically shaped focusing optical elements. In the embodiment depicted in FIG. 1, the magnification of focusing optics 111 at the center of the ellipse is approximately one. As a result, the illumination spot size projected onto the surface of specimen 101 is approximately the same size as the illumination source, adjusted for beam spread due to the nominal grazing incidence angle (e.g., 5-20 degrees).

In a further aspect, focusing optics 111 collect source emission and select one or more discrete wavelengths or spectral bands, and focus the selected light onto specimen 101 at grazing angles of incidence in the range 5-20 degrees.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility RSAXS measurements probe more deeply into the structure with less sensitivity to the precise value of the grazing incidence angle.

In some embodiments, focusing optics 111 include graded multi-layers that select desired wavelengths or ranges of wavelengths for projection onto specimen 101. In some examples, focusing optics 111 includes a graded multi-layer structure (e.g., layers or coatings) that selects one wavelength and projects the selected wavelength onto specimen 101 over a range of angles of incidence. In some examples, focusing optics 111 includes a graded multi-layer structure that selects a range of wavelengths and projects the selected wavelengths onto specimen 101 over one angle of incidence. In some examples, focusing optics 111 includes a graded multi-layer structure that selects a range of wavelengths and projects the selected wavelengths onto specimen 101 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 101, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some other examples, little to no prior structural information is available at the time of measurement. In these examples, multiple wavelengths (e.g., 3-4) are selected to enable measurement of diffraction patterns across the absorption edge. The measured signals enable model-free measurement of structural properties with no prior information except the elemental composition of the structures under measurement using, for example, multiple wavelength anomalous diffraction techniques. After estimating structural properties based on model-free measurements, parameter estimates may be further refined using model-based measurement techniques.

In some examples, the anomalous scattering factors (i.e., scattering properties) of the metrology target under measurement are not known apriori. In these examples, film multilayer reflectivity is measured at multiple resonant wavelengths. Angular excursions of Bragg peaks provide sufficient information to extract the anomalous scattering factors.

In some examples, non-resonant x-ray reflectivity measurements provide independent estimates of multilayer period and interface roughness parameters, which improve the fitting of model-based measurements. In some embodiments, a combined metrology tool includes a multiple wavelength SXR diffraction subsystem as described herein and an x-ray reflectometry subsystem to improve measurement throughput. In one embodiment, the multiple wavelength SXR diffraction subsystem and the x-ray reflectometry subsystem employ orthogonal planes of incidence that enable simultaneous measurements or sequential measurements without having to move the specimen under measurement or either of the optical measurement subsystems. In some embodiments, wafer rotation, detector rotation, or both, may be employed to extend the range of angles of incidence if the AOI range provided by the SXR multilayer mirrors is too small for x-ray reflectometry.

In some embodiments, focusing optics 111 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged each at set at a different angle of incidence. In some embodiments, the multiple sets of reflective optical elements simultaneously project illumination light onto specimen 101 during measurement. In some other embodiments, the multiple sets of reflective optical elements sequentially project illumination light onto specimen 101 during measurement. In these embodiments, active shutters or apertures are employed to control the illumination light projected onto specimen 101.

Figure 2:
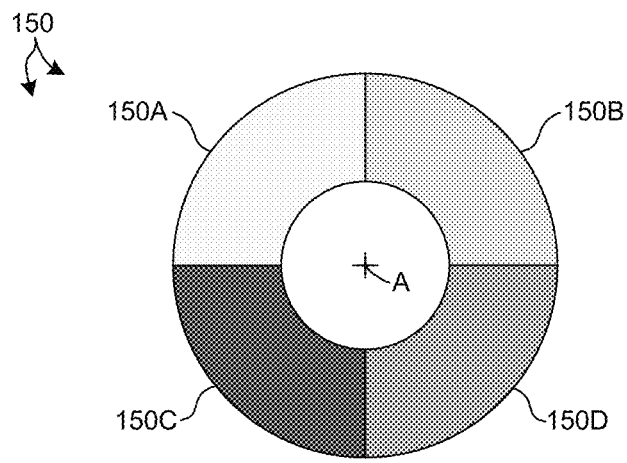
FIG. 2 is a simplified diagram illustrative of an end view of focusing optics including four mirror elements disposed around the beam axis, A, in a segmented toroidal configuration.

In some embodiments, focusing optics 111 focus light at multiple wavelengths, azimuths and AOI on the same metrology target area. FIG. 2 depicts an end view (i.e., along the beam axis) of focusing optics 150 including four mirror elements 150A-150D disposed around the beam axis, A, in a segmented toroidal configuration. Each mirror element includes a multi-layer coating tuned to reflect a different wavelength or range of wavelengths. In some embodiments, each mirror element 150A-D includes a uniform multilayer design (i.e., the surface of a particular mirror element reflects the same wavelength or range of wavelengths over the entire mirror surface area of that particular mirror element). In some other embodiments, each mirror element includes a non-uniform multilayer design (i.e., the wavelength or range of wavelengths reflected by the mirror element depends on the location of incidence on the mirror surface). In some of these embodiments, each mirror element is elliptical in shape and projects illumination light to specimen 101 over a range of angles of incidence. In addition, because the mirror elements are arranged in a toroidal configuration, the mirror elements project illumination light to specimen 101 over a range of azimuth angles. Although, FIG. 2 depicts four mirror elements, in general, focusing optics may include any number of mirror elements arranged to focus light at multiple wavelengths, azimuths and AOI on the same metrology target area. In some other embodiments, focusing optics includes a number of mirror elements nested in the plane of incidence (i.e., a nested Wolter configuration).

In a further aspect, the ranges of wavelengths, AOI, Azimuth, or any combination thereof, projected onto the same metrology area, are adjusted by actively positioning one or more mirror elements of the focusing optics. As depicted in FIG. 1, computing system 130 communicates command signals to actuator system 115 that causes actuator system 115 to adjust the position, alignment, or both, of one or more of the optical elements of focusing optics 111 to achieve the desired ranges of wavelengths, AOI, Azimuth, or any combination thereof, projected onto specimen 101.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an RSAX metrology system (e.g., metrology tool 100) includes one or more beam slits or apertures to shape the illumination beam 114 incident on specimen 101 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an RSAX metrology system (e.g., metrology tool 100) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 1 depicts a beam divergence control slit 112 located in the beam path between focusing optics 111 and beam shaping slit 113. Beam divergence control slit 112 limits the divergence of the illumination provided to the specimen under measurement. Beam shaping slit 113 is located in the beam path between beam divergence control slit 112 and specimen 101. Beam shaping slit 113 further shapes the incident beam 114 and selects the illumination wavelength(s) of incident beam 114. Beam shaping slit 113 is located in the beam path immediately before specimen 101. In one aspect, the slits of beam shaping slit 113 are located in close proximity to specimen 101 to minimize the enlargement of the incident beam spot size due to beam divergence defined by finite source size.

In some embodiments, beam shaping slit 113 includes multiple, independently actuated beam shaping slits. In one embodiment, beam shaping slit 113 includes four independently actuated beam shaping slits. These four beams shaping slits effectively block a portion of the incoming beam and generate an illumination beam 114 having a box shaped illumination cross-section.

Slits of beam shaping slit 113 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

X-ray detector 119 collects x-ray radiation 118 scattered from specimen 101 and generates an output signals 135 indicative of properties of specimen 101 that are sensitive to the incident x-ray radiation in accordance with a RSAXS measurement modality. In some embodiments, scattered x-rays 118 are collected by x-ray detector 119 while specimen positioning system 140 locates and orients specimen 101 to produce angularly resolved scattered x-rays.

In some embodiments, a RSAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a RSAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on RSAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 3:
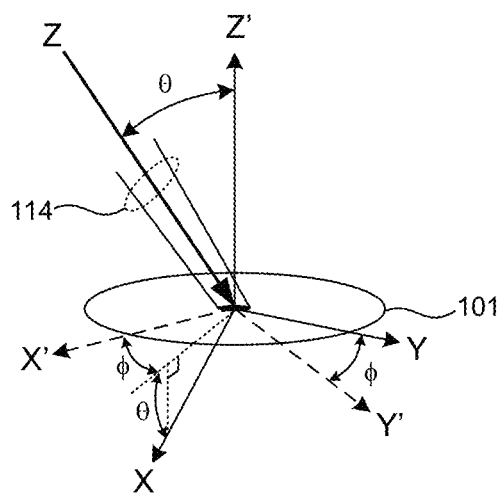
FIG. 3 depicts x-ray illumination beam incident on a wafer at a particular orientation described by an angle of incidence, $\theta$, and an azimuth angle, $\phi$.

Each orientation of the illuminating x-ray beam 114 relative to the surface normal of a semiconductor wafer 101 is described by any two angular rotations of wafer 101 with respect to the x-ray illumination beam 114, or vice-versa. In one example, the orientation can be described with respect to a coordinate system fixed to the wafer. FIG. 3 depicts x-ray illumination beam 114 incident on wafer 101 at a particular orientation described by an angle of incidence, θ, and an azimuth angle, ϕ. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 3, x-ray illumination beam 114 is aligned with the Z-axis and thus lies within the XZ plane. Angle of incidence, θ, describes the orientation of the x-ray illumination beam 114 with respect to the surface normal of the wafer in the XZ plane. Furthermore, azimuth angle, ϕ, describes the orientation of the XZ plane with respect to the X'Z' plane. Together, θ and ϕ, uniquely define the orientation of the x-ray illumination beam 114 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, metrology tool 100 includes a wafer chuck 103 that fixedly supports wafer 101 and is coupled to specimen positioning system 140. Specimen positioning system 140 configured to actively position specimen 101 in six degrees of freedom with respect to illumination beam 114. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

In a further aspect, the focusing optics of an RSAXS system projects an image of the illumination source onto the specimen under measurement with a demagnification of at least five (i.e., magnification factor of 0.2 or less). An RSAXS system as described herein employs a SXR illumination source having a source area characterized by a lateral dimension of 20 micrometers or less (i.e., source size is 20 micrometers or smaller). In some embodiments, focusing optics are employed with a demagnification factor of at least five (i.e., project an image of the source onto the wafer that is five times smaller than the source size) to project illumination onto a specimen with an incident illumination spot size of four micrometers or less.

Figure 4:
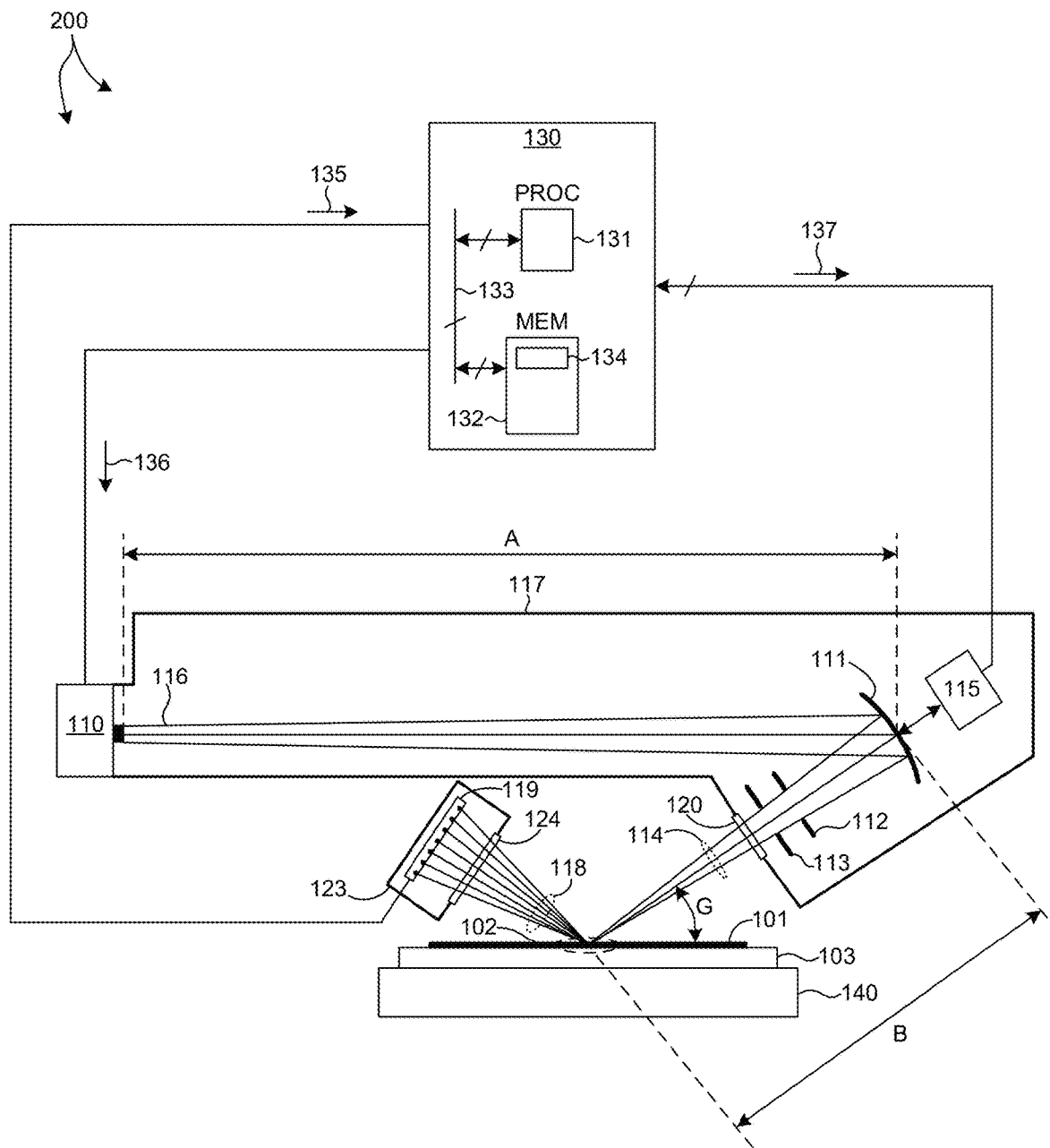
FIG. 4 is a simplified diagram illustrative of another embodiment of a RSAXS metrology tool employed to perform RSAXS measurements over a measurement area having dimensions less than 1-2 micrometers.

FIG. 4 illustrates an embodiment of a RSAXS metrology tool 200 in another embodiment. As illustrated in FIG. 4, the system 200 may be used to perform RSAXS measurements over a measurement area 102 having dimensions less than 1-2 micrometers. Like numbered elements depicted in FIG. 4 are analogous to those described with reference to FIG. 1. As depicted in FIG. 4, focusing optics 111 are elliptical optical elements. However, focusing optics 111 are arranged with respect to illumination source 110 and specimen 101 such that the distance, A, between illumination source 110 and focusing optics 111 is significantly greater than the distance, B, between focusing optics 111 and specimen 101. In some embodiments, the ratio of A/B is at least five. In some embodiments, the ratio of A/B is at least ten. This results in a demagnification of the illumination source onto specimen 101 by a factor of A/B. In one embodiment, the size of illumination source 110 is approximately 10 micrometers and focusing optics 111 are arranged such that A/B is ten. In this embodiment, the illumination spot size projected onto specimen 101 is approximately 1 micrometer.

In some embodiments, illumination source 110 is an LPP light source having a source size of 10 micrometers, or less, and focusing optics 111 have a demagnification factor of approximately 10. This enables RSAXS metrology tool 200 to focus illumination light onto a metrology target having dimensions of 1-2 micrometers. By focusing incident illumination light to an illumination spot size of 1-2 micrometers, RSAXS metrology tool 200 enables the measurement of critical dimension targets and overlay targets located in-die, rather than relying on larger metrology targets located in the wafer scribe line areas.

The ability to measure targets having dimensions of 1-2 micrometers reduces the wafer area committed to specialized metrology targets. In addition, the ability to measure targets having dimensions of 1-2 micrometers enables the direct measurement of device structures, rather than specialized metrology targets. Measuring device structures directly eliminates target-to-device bias. This significantly improves measurement quality. In addition, measurements of in-die targets enable characterization of parameter variation within-die. Exemplary parameters of interest include critical dimensions, overlay, and edge placement errors.

Figure 5A:
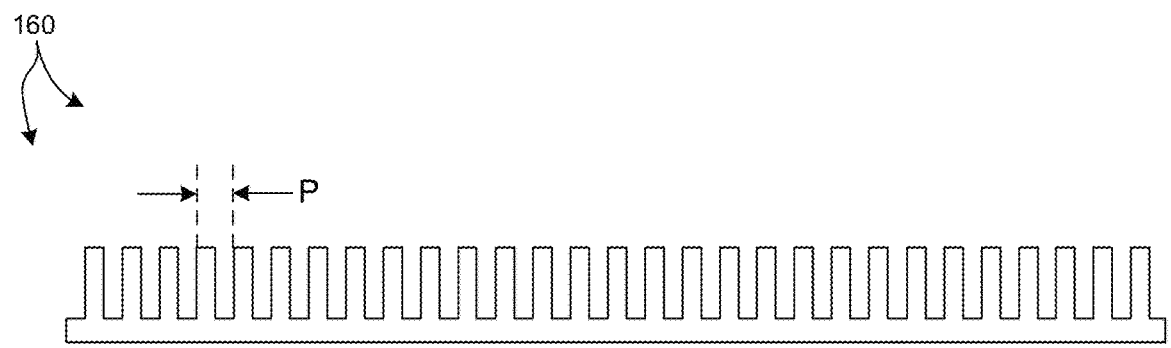
FIG. 5A depicts a simplified diagram illustrative of a metrology target having a periodic grating structure having a pitch, P.
Figure 5B:
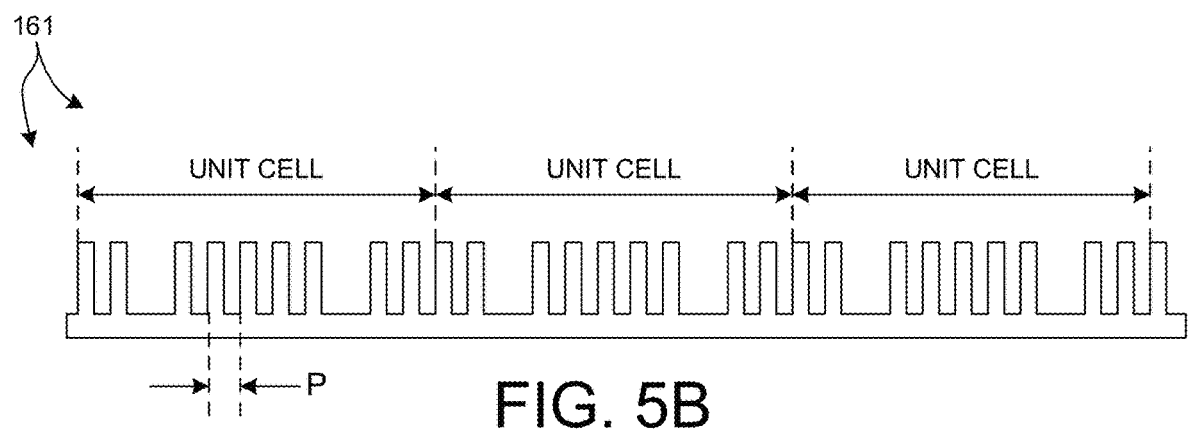
FIG. 5B depicts a simplified diagram illustrative of a decimated metrology target having a nominally periodic grating structure of pitch, P, with specified elements of the grating structure deleted.

In some embodiments, a RSAXS metrology system as described herein is employed to measure periodic metrology targets. For example, FIG. 5A depicts a metrology target 160 having a periodic grating structure having a pitch, P. However, in another aspect, a RSAXS metrology system as described herein is employed to measure decimated metrology targets that exhibit both periodicity and aperiodicity. A decimated metrology target is a metrology target including an array of nominally periodic unit cells, and one or more cells of the nominally periodic array are deleted, displaced, or structurally modified at programmed or random locations within the array. For example, FIG. 5B depicts a metrology target 161 having a nominally periodic grating structure of pitch, P. However, in addition, specific fins of the grating structure are not present in metrology target 161. As a result, angular distribution of scattering from metrology target 161 under measurement exhibits both periodic properties, leading to localized diffraction peaks, and aperiodic behavior, also known as diffuse scattering.

In general, the distribution of diffuse scattering between Bragg peaks is increased by deleting elements of a nominally periodic unit cell array in a random or programmed manner. Diffuse intensity angular distribution is proportional to the structure factor squared. When decimated metrology targets are employed, Bragg peak intensity decreases, but more pixels include non-zero information content as the scattered light is spread over more pixels. Since model-based measurements are able to use information from all pixels, the overall increase in information content of the measurement improves measurement precision and accuracy. In general, Bragg peak intensity decreases as the fraction of deleted cells increases. The desired decimation of the metrology target maximizes overall measurement information content. In some examples, decimated metrology targets resolve ambiguity that occurs in cases where the structure factor of a metrology target is zero at a large subset of Bragg peak locations (e.g., a square wave at 50% duty cycle). An RSAXS metrology system may be employed to measure a decimated metrology target in a sequential, single wavelength mode of operation or in a simultaneous, multiple wavelength mode of operation.

In some embodiments, a metrology target includes a general or specific aperiodicity selected to maximize signal information and thus minimize acquisition time. Design rules for logic standard cell arrays place primitive elements on a fixed grid and control pattern density variations within narrow ranges. Metrology of logic structures is focused on achieving a high precision estimate of average feature size and separation in a local region. Occupancy and periodicity is not of interest because these aspects are well controlled in the lithography process. A metrology target for logic structures optimizes the distribution of intensity such that scattering flux is increased in angular regions which contain high information content with respect to the desired feature parameter set. In one example, a metrology target includes a border region to enhance the information content of diffraction by a central region.

SXR enables overlay measurements on design-rule targets because the illumination wavelength(s) are shorter than the period of the measured structures. This provides a significant benefit over existing technology where overlay is measured on larger than the design rule targets. Use of SXR wavelengths permits target design at process design rules, i.e., no "non-zero offsets".

An overlay metrology target for RSAXS measurements may include one dimensional periodic arrays or two dimensional periodic arrays. One dimensional targets exhibit large angular divergence along the plane of incidence, increasing flux and throughput. For two dimensional targets angular dispersion of diffraction is not equivalent for the two in-plane axes. Thus, for sample directions parallel to the plane of incidence, an additional, super-period may be imposed. In these examples, it may be advantageous to rotate the wafer and perform sequential, orthogonal measurements by a single subsystem on the same target.

In another further aspect, an overlay metrology target for RSAXS measurements may be employed to measure both overlay and critical dimensions. This also enables measurements of Edge Placement Errors (EPE), such as end line shortening, line to contact distance, etc.

In some embodiments, x-ray illumination source 110, focusing optics 111, slits 112 and 113, or any combination thereof, are maintained in the same atmospheric environment as specimen 101 (e.g., gas purge environment). However, in some embodiments, the optical path length between and within any of these elements is long and x-ray scattering in air contributes noise to the image on the detector. Hence in some embodiments, any of x-ray illumination source 110, focusing optics 111, and slits 112 and 113 are maintained in a localized, vacuum environment. In the embodiment depicted in FIG. 1, illumination source 110, focusing optics 111, and slits 112 and 113 are maintained in a controlled environment (e.g., vacuum) within an evacuated flight tube 117. The illumination beam 114 passes through window 120 at the end of flight tube 117 before incidence with specimen 101.

Similarly, in some embodiments, the optical path length between specimen 101 and detector 119 (i.e., the collection beam path) is long and x-ray scattering in air contributes noise to the image on the detector. Hence, in preferred embodiments, a significant portion of the collection beam path length between specimen 101 and detector 119 is maintained in a localized vacuum environment separated from the specimen (e.g., specimen 101) by a vacuum window (e.g., vacuum window 124). In some embodiments, x-ray detector 119 is maintained in the same localized vacuum environment as the beam path length between specimen 101 and detector 119. For example, as depicted in FIG. 1, vacuum chamber 123 maintains a localized vacuum environment surrounding detector 119 and a significant portion of the beam path length between specimen 101 and detector 119.

In some other embodiments, x-ray detector 119 is maintained in the same atmospheric environment as specimen 101 (e.g., gas purge environment). This may be advantageous to remove heat from detector 119. However, in these embodiments, it is preferable to maintain a significant portion of the beam path length between specimen 101 and detector 119 in a localized vacuum environment within a vacuum chamber.

In some embodiments, the entire optical system, including specimen 101, is maintained in vacuum. However, in general, the costs associated with maintaining specimen 101 in vacuum are high due to the complexities associated with the construction of specimen positioning system 140.

In another further aspect, computing system 130 is configured to generate a structural model (e.g., geometric model, material model, or combined geometric and material model) of a measured structure of a specimen, generate a RSAXS response model that includes at least one geometric parameter from the structural model, and resolve at least one specimen parameter value by performing a fitting analysis of RSAXS measurement data with the RSAXS response model. The analysis engine is used to compare the simulated RSAXS signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 6:
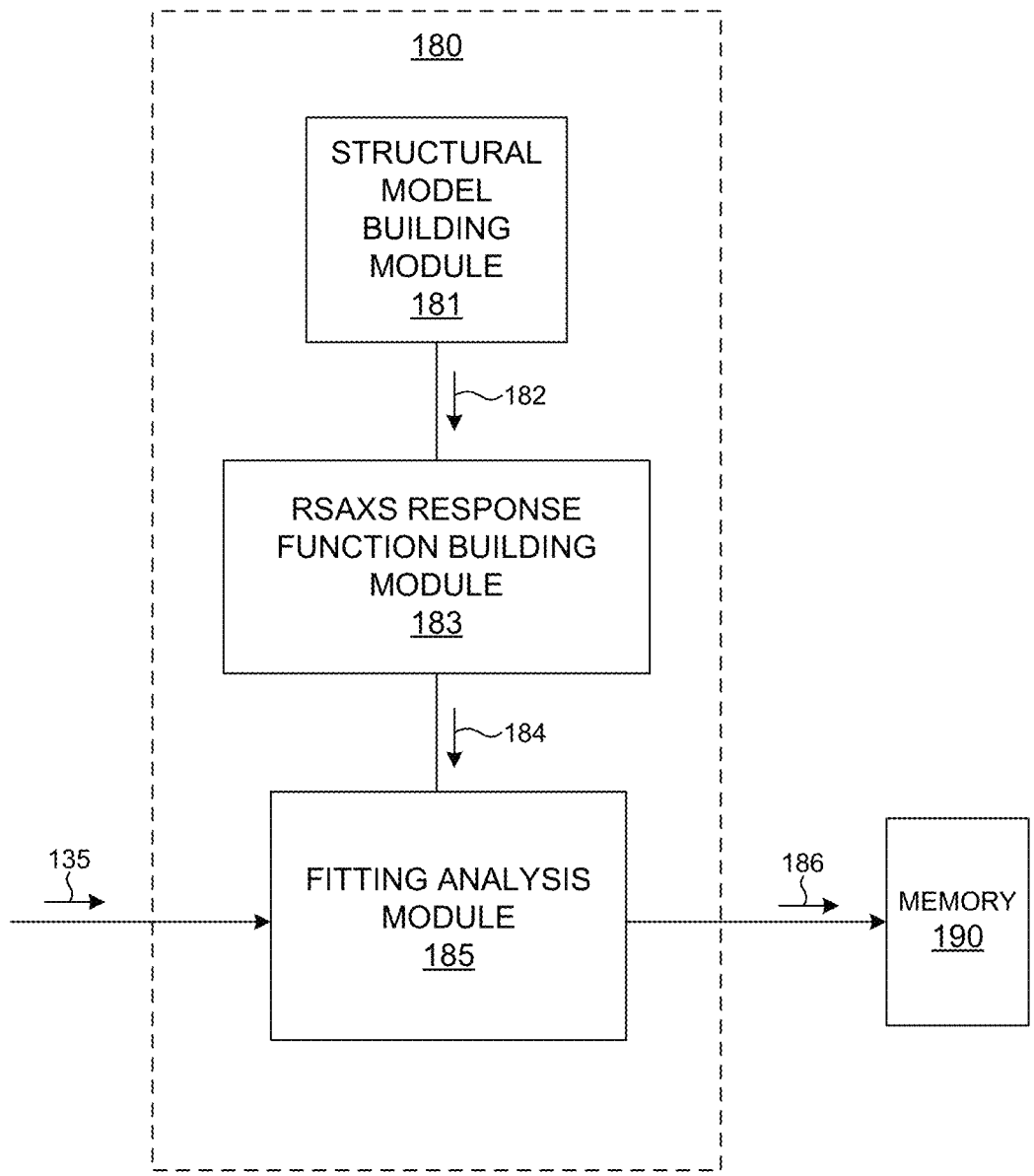
FIG. 6 is a simplified diagram illustrative of an exemplary model building and analysis engine.

FIG. 6 is a diagram illustrative of an exemplary model building and analysis engine 180 implemented by computing system 130. As depicted in FIG. 6, model building and analysis engine 180 includes a structural model building module 181 that generates a structural model 182 of a measured structure of a specimen. In some embodiments, structural model 182 also includes material properties of the specimen. The structural model 182 is received as input to RSAXS response function building module 183. RSAXS response function building module 183 generates a RSAXS response function model 184 based at least in part on the structural model 182. In some examples, the RSAXS response function model 184 is based on x-ray form factors, also known as structure factors, $$F(q^P) = \int \rho(r^P) e^{-iq^P \cdot r^P} dr^P \quad (1)$$

where F is the form factor, q is the scattering vector, and ρ(r) is the electron density of the specimen in spherical coordinates. The x-ray scattering intensity is then given by $$I(\vec{q}) = F^* F. \quad (2)$$

RSAXS response function model 184 is received as input to fitting analysis module 185. The fitting analysis module 185 compares the modeled RSAXS response with the corresponding measured data to determine geometric as well as material properties of the specimen.

In some examples, the fitting of modeled data to experimental data is achieved by minimizing a chi-squared value. For example, for RSAXS measurements, a chi-squared value can be defined as $$\chi^2_{SAXS} = \frac{1}{N_{SAXS}} \sum_j^{N_{SAXS}} \left( \frac{S_j^{SAXS\ model}(v_1, \ldots, v_L) - S_j^{SAXS\ experiment}}{\sigma^2_{SAXS,j}} \right)^2 \quad (3)$$

Where, $S_j^{SAXS\ experiment}$ is the measured RSAXS signals 126 in the "channel" j, where the index j describes a set of system parameters such as diffraction order, energy, angular coordinate, etc. $S_j^{SAXS\ model}(v_1, \ldots, v_L)$ is the modeled RSAXS signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (3) assumes that the uncertainties associated with different channels are uncorrelated. In examples where the uncertainties associated with the different channels are correlated, a covariance between the uncertainties, can be calculated. In these examples a chi-squared value for RSAXS measurements can be expressed as $$\chi^2_{SAXS} = \frac{1}{N_{SAXS}} \left( \vec{S}_j^{SAXS.\ model}(v_1, \ldots, v_M) - \vec{S}_j^{SAXS.\ experiment} \right)^T \quad (4)$$
$$V_{SAXS}^{-1} \left( \vec{S}_j^{SAXS.\ model}(v_1, \ldots, v_M) - \vec{S}_j^{SAXS.\ experiment} \right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on RSAXS measurement data 135 with the RSAXS response model 184. In some examples, $\chi^2_{SAXS}$ is optimized.

As described hereinbefore, the fitting of RSAXS data is achieved by minimization of chi-squared values. However, in general, the fitting of RSAXS data may be achieved by other functions.

The fitting of RSAXS metrology data is advantageous for any type of RSAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing RSAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on RSAXS measurements performed at a single orientation of the incident x-ray beam with respect to the measurement target. The initial, estimated values are implemented as the starting values of the parameters of interest for a regression of the measurement model with measurement data collected from RSAXS measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 114.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 114 on specimen 101 is determined by computing system 130. In one example, pattern recognition techniques are applied by computing system 130 to determine the location and area of incidence of illumination beam 114 on specimen 101 based on measurement data 135. In some examples, computing system 130 communicates command signals 136 to x-ray illumination source 110 to select the desired illumination wavelength. In some examples, computing system 130 communicates command signals 137 to actuator subsystem 115 to redirect the x-ray emission to achieve a desired beam direction. In some examples, computing system 130 communicates command signals 138 and 139 to beam shaping slits 112 and 113, respectively, that cause beam shaping slits 112 and 113 to change the beam spot size and select illumination wavelengths such that incident illumination beam 114 arrives at specimen 101 with the desired beam spot size, orientation, and wavelength(s). In one example, command signals 138 and 139 cause actuators associated with slits 112 and 113 to change position to reshape the incident beam 114 to a desired shape and size and select desired wavelengths. In some other examples, computing system 130 communicates a command signal to wafer positioning system 140 to position and orient specimen 101 such that incident illumination beam 114 arrives at the desired location and angular orientation with respect to specimen 101.

In a further aspect, RSAXS measurement data is used to generate an image of a measured structure based on the measured intensities of the detected diffraction orders. In some embodiments, a RSAXS response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on RSAXS measurements, a map of the specimen generated from the same RSAXS measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 180 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the x-ray diffraction orders at the plurality of different angles of incidence and detected optical intensities with a combined, geometrically parameterized response model. The optical intensities are measured by an optical metrology tool that may or may not be mechanically integrated with an x-ray metrology system, such as systems 100 depicted in FIG. 1. Further details are described in U.S. Patent Publication No. 2014/0019097 and U.S. Patent Publication No. 2013/0304424, the contents of each are incorporated herein by reference it their entirety.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slits 112 and 113, focusing optics actuator system 115, specimen positioning system 140, and detector 119 in any manner known in the art. For example, the one or more computing systems 130 may be coupled to computing systems associated with the x-ray illumination source 110, beam shaping slits 112 and 113, focusing optics actuator system 115, specimen positioning system 140, and detector 119, respectively. In another example, any of the x-ray illumination source 110, beam shaping slits 112 and 113, focusing optics actuator system 115, specimen positioning system 140, and detector 119 may be controlled directly by a single computer system coupled to computer system 130.

The computer system 130 may be configured to receive and/or acquire data or information from the subsystems of the system (e.g., x-ray illumination source 110, beam shaping slits 112 and 113, focusing optics actuator system 115, specimen positioning system 140, detector 119, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, spectral results obtained using detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 7:
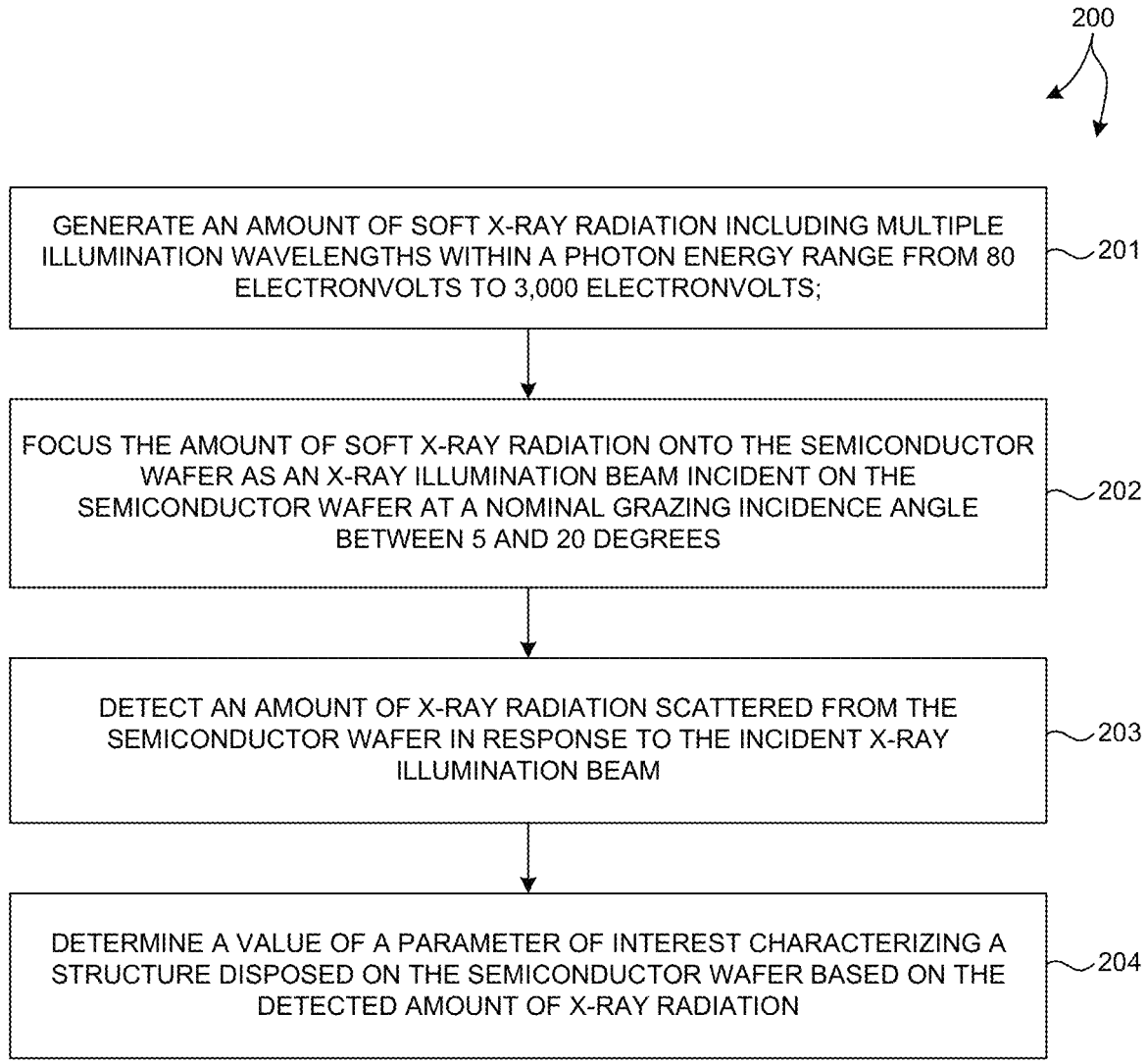
FIG. 7 is a flowchart of a method of performing polychromatic, RSAXS measurements of a semiconductor wafer in accordance with the methods described herein.

FIG. 7 illustrates a method 200 suitable for implementation by the metrology systems 100 and 200 of the present invention. In one aspect, it is recognized that data processing blocks of method 200 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 301, an amount of soft x-ray radiation is generated by an x-ray illumination source. The soft x-ray radiation includes multiple illumination wavelengths within a photon energy range from 80 electronvolts to 3,000 electronvolts.

In block 302, the amount of soft x-ray radiation is focused onto the semiconductor wafer as an x-ray illumination beam incident on the semiconductor wafer at a nominal grazing incidence angle between 5 and 20 degrees.

In block 303, an amount of x-ray radiation scattered from the semiconductor wafer in response to the incident x-ray illumination beam is detected by a detector of a RSAX metrology system.

In block 304, a value of a parameter of interest characterizing a structure disposed on the semiconductor wafer is determined based on the detected amount of x-ray radiation.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a RSAXS analysis are used to control a fabrication process. In one example, RSAXS measurement data collected from one or more targets is sent to a fabrication process tool. The RSAXS measurement data is analyzed as described herein and the results used to adjust the operation of the fabrication process tool to reduce errors in the manufacture of semiconductor structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with RSAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an x-ray illumination source configured to generate an amount of soft x-ray radiation including multiple illumination wavelengths within a photon energy range from 80 electronvolts to 3,000 electronvolts;
   one or more x-ray illumination optical elements disposed in an illumination optical path between the x-ray illumination source and a semiconductor wafer, wherein the one or more x-ray illumination optical elements focus the amount of soft x-ray radiation including the multiple illumination wavelengths onto the semiconductor wafer as an x-ray illumination beam incident on the semiconductor wafer at a nominal grazing incidence angle between 5 and 20 degrees;
   an x-ray detector configured to detect an amount of x-ray radiation scattered from the semiconductor wafer in response to the incident x-ray illumination beam; and
   a computing system configured to determine a value of a parameter of interest characterizing a structure disposed on the semiconductor wafer based on the detected amount of x-ray radiation.

2. The metrology system of claim 1, wherein the one or more x-ray illumination optical elements simultaneously focus the amount of soft x-ray radiation including the multiple illumination wavelengths onto the semiconductor wafer as an x-ray illumination beam incident on the semiconductor wafer at a plurality of angles of incidence, a plurality of wavelengths, and a plurality of azimuth angles.

3. The metrology system of claim 1, wherein the one or more x-ray illumination optical elements select a subset of the multiple illumination wavelengths and focus the selected subset of the multiple wavelengths onto the semiconductor wafer as an x-ray illumination beam incident on the semiconductor wafer.

4. The metrology system of claim 3, wherein the one or more x-ray illumination optical elements simultaneously focus the selected subset of the multiple wavelengths onto the semiconductor wafer at a plurality of angles of incidence and a plurality of azimuth angles.

5. The metrology system of claim 3, wherein the one or more x-ray illumination optical elements are graded multilayer optical elements that select the subset of the multiple illumination wavelengths.

6. The metrology system of claim 5, the one or more x-ray illumination optical elements are elliptically shaped optical elements arranged in a toroidal configuration that simultaneously focuses the x-ray illumination beam incident on the semiconductor wafer at a plurality of angles of incidence and a plurality of azimuth angles.

7. The metrology system of claim 1, wherein the one or more x-ray illumination optical elements focus the amount of soft x-ray radiation onto a metrology target disposed on the semiconductor wafer, wherein the metrology target includes an array of nominally periodic unit cells, wherein one or more cells of the nominally periodic array are deleted, displaced, or structurally modified at programmed or random locations within the array.

8. The metrology system of claim 1, wherein the parameter of interest is any of an overlay error, a critical dimension, and an edge placement error.

9. The metrology system of claim 1, wherein a source area of the x-ray illumination source is characterized by a lateral dimension of 10 micrometers or less.

10. The metrology system of claim 1, wherein the one or more x-ray illumination optical elements focus the amount of soft x-ray radiation onto the semiconductor wafer with a magnification factor of 0.2 or less.

11. The metrology system of claim 1, further comprising:
a first vacuum chamber enveloping a significant portion of an illumination optical path between the x-ray illumination source and the semiconductor wafer.

12. The metrology system of claim 1, further comprising:
a first vacuum chamber enveloping a significant portion of a collection beam path between the semiconductor wafer and the x-ray detector.

13. The metrology system of claim 1, further comprising:
a specimen positioning system configured to position the specimen with respect to the x-ray illumination beam such that the x-ray illumination beam is incident on the surface of the specimen at any location on the surface of the specimen and rotate the specimen with respect to the x-ray illumination beam about an axis of rotation such that the x-ray illumination beam is incident on the surface of the specimen at any location at a plurality of angles of incidence and rotate the specimen about an azimuth axis of rotation such that the x-ray illumination beam is incident on the surface of the specimen at any location at a plurality of azimuth angles.

14. A method comprising:
generating an amount of soft x-ray radiation including multiple illumination wavelengths within a photon energy range from 80 electronvolts to 3,000 electronvolts;
focusing the amount of soft x-ray radiation including the multiple illumination wavelengths onto a semiconductor wafer as an x-ray illumination beam incident on the semiconductor wafer at a nominal grazing incidence angle between 5 and 20 degrees;
detecting an amount of x-ray radiation scattered from the semiconductor wafer in response to the incident x-ray illumination beam; and
determining a value of a parameter of interest characterizing a structure disposed on the semiconductor wafer based on the detected amount of x-ray radiation.

15. The method of claim 14, further comprising:
simultaneously focusing the amount of soft x-ray radiation including the multiple illumination wavelengths onto the semiconductor wafer as an x-ray illumination beam incident on the semiconductor wafer at a plurality of angles of incidence, a plurality of wavelengths, and a plurality of azimuth angles.

16. The method of claim 14, further comprising:
selecting a subset of the multiple illumination wavelengths and focusing the selected subset of the multiple wavelengths onto the semiconductor wafer.

17. The method of claim 16, further comprising:
simultaneously focusing the selected subset of the multiple wavelengths onto the semiconductor wafer at a plurality of angles of incidence and a plurality of azimuth angles.

18. The method of claim 14, wherein the amount of soft x-ray radiation is focused onto a metrology target disposed on the semiconductor wafer, wherein the metrology target includes an array of nominally periodic unit cells, wherein one or more cells of the nominally periodic array are deleted, displaced, or structurally modified at programmed or random locations within the array.

19. The method of claim 14, wherein the parameter of interest is any of an overlay error, a critical dimension, and an edge placement error.

20. A metrology system comprising:
an x-ray illumination source configured to generate an amount of soft x-ray radiation including multiple illumination wavelengths within a photon energy range from 80 electronvolts to 3,000 electronvolts;
one or more x-ray illumination optical elements disposed in an illumination optical path between the x-ray illumination source and a semiconductor wafer, wherein the one or more x-ray illumination optical elements focus the amount of soft x-ray radiation including the multiple wavelengths onto a metrology target disposed on the semiconductor wafer as an x-ray illumination beam incident on the metrology target at a nominal grazing incidence angle between 5 and 20 degrees, wherein the metrology target includes an array of nominally periodic unit cells, wherein one or more structural elements of each nominally periodic unit cell is deleted at a programmed or random location within each of the unit cells;
an x-ray detector configured to detect an amount of x-ray radiation scattered from the semiconductor wafer in response to the incident x-ray illumination beam; and
a computing system configured to determine a value of a parameter of interest characterizing a structure disposed on the semiconductor wafer based on the detected amount of x-ray radiation.

21. The metrology system of claim 20, wherein the one or more x-ray illumination optical elements simultaneously focus the amount of soft x-ray radiation including the multiple illumination wavelengths onto the metrology target as an x-ray illumination beam incident on the metrology target at a plurality of angles of incidence, a plurality of wavelengths, and a plurality of azimuth angles.

22. The metrology system of claim 20, wherein the one or more x-ray illumination optical elements select a subset of the multiple illumination wavelengths and focus the selected subset of the multiple wavelengths onto the metrology target.

23. The metrology system of claim 22, wherein the one or more x-ray illumination optical elements simultaneously focus the selected subset of the multiple wavelengths onto the semiconductor wafer at a plurality of angles of incidence and a plurality of azimuth angles.

24. The metrology system of claim 22, wherein the one or more x-ray illumination optical elements are graded multi-layer optical elements that select the subset of the multiple illumination wavelengths.

25. The metrology system of claim 24, the one or more x-ray illumination optical elements are elliptically shaped optical elements arranged in a toroidal configuration that simultaneously focuses the x-ray illumination beam incident on the semiconductor wafer at a plurality of angles of incidence and a plurality of azimuth angles.

26. The metrology system of claim 20, wherein a source area of the x-ray illumination source is characterized by a lateral dimension of 10 micrometers or less.

27. The metrology system of claim 20, wherein the one or more x-ray illumination optical elements focus the amount of soft x-ray radiation onto the semiconductor wafer with a magnification factor of 0.2 or less.

* * * * *